United States Patent [19]

Peile et al.

[11] Patent Number: 4,835,772
[45] Date of Patent: May 30, 1989

[54] PROBABILISTIC FADE FORECASTING

[75] Inventors: Robert E. Peile, Pasadena; Earl T. Cohen, Berkeley, both of Calif.

[73] Assignee: Cyclotomics, Inc., Berkeley, Calif.

[21] Appl. No.: 141,241

[22] Filed: Jan. 6, 1988

[51] Int. Cl.$^4$ .............................................. G06F 11/10
[52] U.S. Cl. ............................................ 371/2; 371/40
[58] Field of Search .................. 371/2, 37, 39, 40, 44, 371/45, 31

[56] References Cited

U.S. PATENT DOCUMENTS 4,291,406  9/1981  Bahl ........................................ 371/44
4,559,625  12/1985  Berlekamp .......................... 371/40 X
4,683,572  7/1987  Baggen ............................... 371/39 X Primary Examiner—Jerry Smith
Assistant Examiner—Robert W. Beausoliel
Attorney, Agent, or Firm—Robert M. Wallace

[57] ABSTRACT

A block of helically interleaved codewords is received in a de-interleaving array. A succession of codewords obtained from the de-interleaving array are decoded in a process in which each error pattern in a given codeword position provides a prediction of the presence or absence of an erasure in the adjacent codeword position of the next codeword. This prediction is obtained by addressing a look-up table with the error pattern. In one embodiment of the invention, the erasure prediction is computed recursively from previous erasure predictions using individual skepticism factors and forgetting factors for each codeword symbol position.

26 Claims, 6 Drawing Sheets

DATA PLUS SYNC STREAM:

INTERLEAVING ARRAY:

01,
02, 09,           CODEWORD
03, 10, 17,            1
04, 11, 18, 25,
05, 12, 19, 26, 33,
06, 13, 20, 27, 34, 41,
07, 14, 21, 28, 35, 42, 49,
 S, 15, 22, 29, 36, 43, 50,
57,  S, 23, 30, 37, 44, 51,
58, 65,  S, 31, 38, 45, 52,
59, 66, 73,  S, 39, 46, 53,
60, 67, 74, 81,  S, 47, 54,
61, 68, 75, 82, 89,  S, 55,
62, 69, 76, 83, 90, XX, S,
63, 70, 77, 84, 91, XX, XX,
 S, 71, 78, 85, 92, XX, XX,
     S, 79, 86, 93, XX, XX,
         S, 87, 94, XX, XX,
             S, 95, XX, XX,
                 S, XX, XX,
                     S, XX,
                         S,

FIG. 1(b)

TRANSMITTED STREAM (PARTIAL):

|←———— A ————→|←———— B ————→|←— C —→|
S, 07,14, 21,28,35,42,49, S, 15,22,29,36,43,50,57, S, 23,30,37,44,51,
58,65, S, 31,38,45,52,59,66,73, S, 39,46,53,60,67,74,81, S, 47, 54,
61,68,75,82,89, S,55,62,69,76,83,90,XX, S,63,70,77,84,91,XX,XX,

FIG. 1(c)

SYMBOL 1  | 49 |   | 42 | 35 | 28 | 21 | 14 | 07 | S | 41 | 34 |

SYMBOL 2  | 50 |   | 43 | 36 | 29 | 22 | 15 | S |

SYMBOL 3  | 51 |   | 44 | 37 | 30 | 23 | S |

SYMBOL 4  | 52 |   | 45 | 38 | 31 | S |

SYMBOL 5  | 53 |   | 46 | 39 | S |

SYMBOL 6  | 54 |   | 47 | S |

SYMBOL 7  | 55 |   | S |

FIG. 2

TIME

PROBABILISTIC FADE FORECASTING

RELATED APPLICATIONS

This application contains subject matter related to U.S. Pat. No. 4,821,288 issued Apr. 11, 1989 by Robert E. Peile entitled "Parallel Channel Equalizer Architecture."

BACKGROUND OF THE INVENTION

Communication in a fading channel (such as a high frequency channel) or in a noisy channel (such as the input-output interface of a disk drive) requires error correction encoding and decoding to recover data lost due to noise or fading. Encoding and decoding systems using, for example, Reed-Solomon codes, can correct twice as many erasures as they can errors for a given number of redundant symbols per codeword. Thus, error correction capacity is significantly enhanced by providing the decoder with the locations of erasures in a received codeword before the decoder begins decoding that codeword. The problem is how to predict where the erasures will be. This problem was solved using techniques which are a subject of U.S. Pat. No. 4,559,625 by Elwyn R. Berlekamp and Po Tong. The solution is to helically interleave a block of codewords together prior to transmission. Upon reception, and depending upon the position of a given symbol in the codeword, the receiver has already decoded a number of codewords containing symbols which were transmitted immediately preceding the given symbol of the present codeword. Therefore, the decoder knows whether or not the immediately preceding symbols were erroneous in the prior codewords. In one embodiment, the decoder simply inquires whether the symbol transmitted immediately before the current symbol of interest was identified as an error location when it was decoded. If so, the current symbol is identified as an erasure location to the decoder before the decoder begins decoding the present codeword.

OBJECT OF THE INVENTION

The object of the present invention is to provide a more reliable erasure prediction using the same helical interleaving technique referenced above.

SUMMARY OF THE INVENTION

In a received block of helically interleaved codewords, the error pattern of each decoded symbol in the present codeword addresses a look-up table in order to find an erasure prediction for the adjacent symbol location in the next codeword to be decoded. If an erasure is predicted for a given position in the next codeword, the decoder treats that position as an erasure location before it begins its decoding process.

In one embodiment of the invention, all of the decoded versions of symbols transmitted immediately preceding the current symbol of interest are retained and used to compute the prediction. In accordance with the helical interleaving process, such retention is accomplished by a stepped array of shift registers.

In the preferred embodiment of the invention, the reliability value which provides an erasure prediction for a given codeword position is recursively computed by combining the present value obtained from the look-up table with the corresponding reliability value computed during the previous codeword time. In this embodiment, the previous values are diminished in importance using forgetting factors and/or skepticism factors in the recursive calculation of the current reliability value. The reliability value thus obtained may be transmitted to a soft decision decoder which then performs the error correction task.

DESCRIPTION OF THE DRAWINGS

The invention may be understood by reference to the accompanying drawings of which:

FIGS. 1a, 1b and 1c illustrate the process of helical interleaving and helical de-interleaving used in the present invention;

FIG. 2 illustrates the availability of decoded versions of symbols transmitted immediately prior to each of the symbols in a given codeword in the helically interleaved array of FIG. 1b;

DETAILED DESCRIPTION

Error History Information

Figure 3:
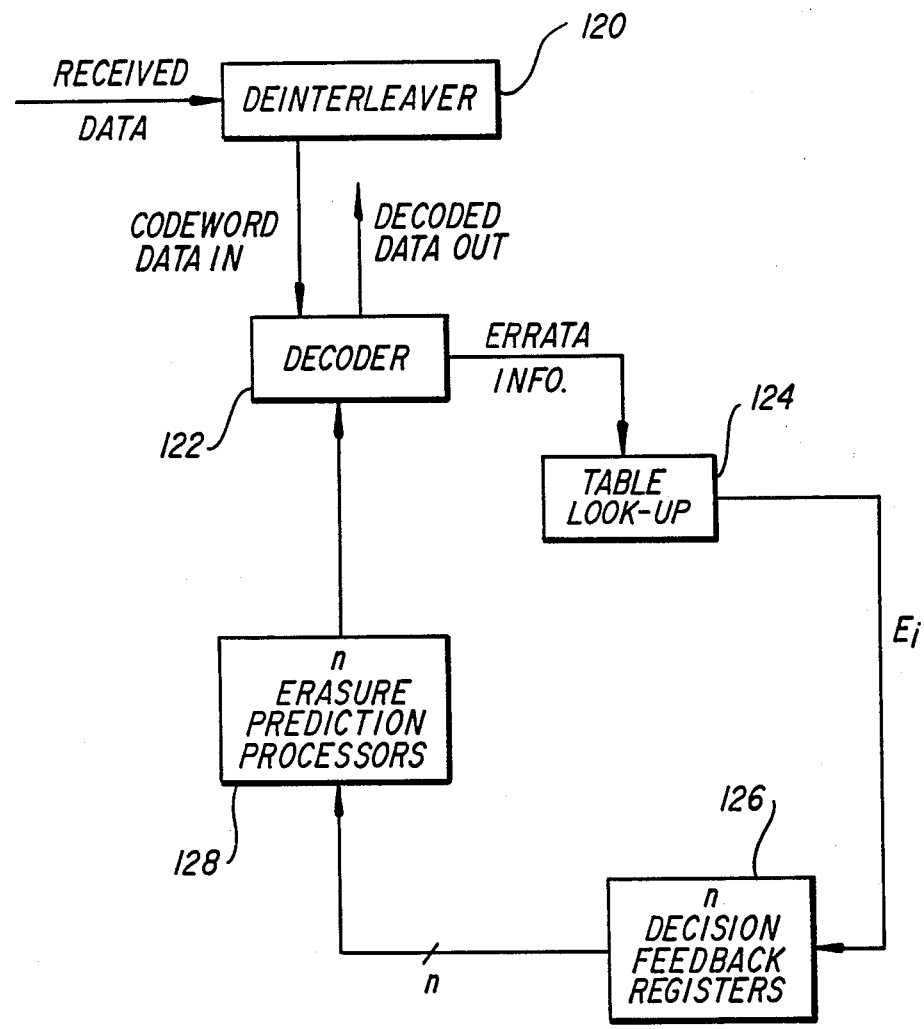
FIG. 3 is a schematic diagram illustrating the system of the present invention.

In a helically interleaved block code, there is a certain amount of history that can be gleaned from the prior performance of the decoder. For a memoryless channel, such information is irrelevant, but for a channel in which the noise exhibits memory, for example a burst error channel, the history can and should be exploited.

Figures 1A, 1B, 1C:
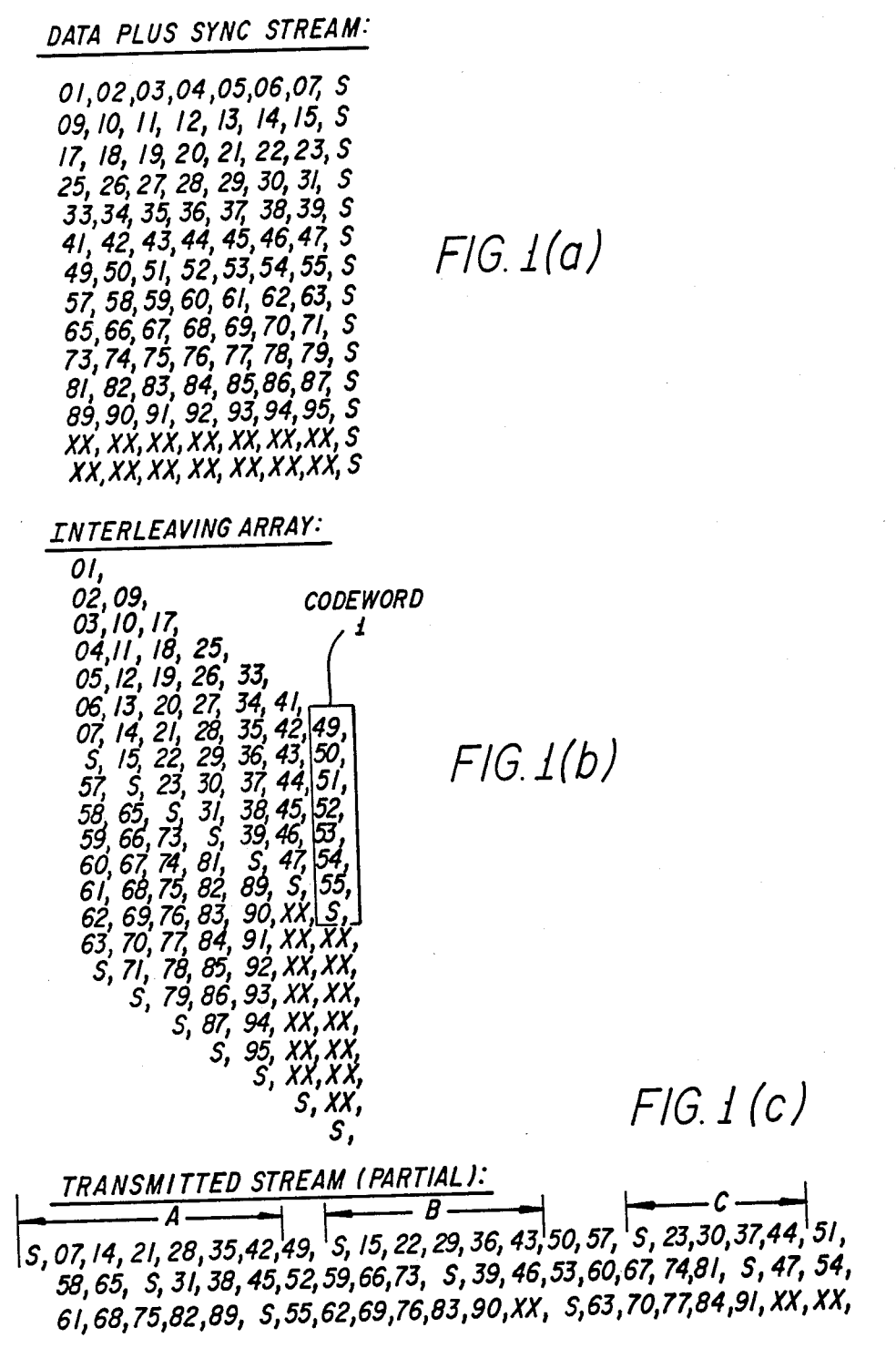

Helical interleaving is accomplished in accordance with U.S. Pat. No. 4,559,625 by assembling a block of codewords (as illustrated in the example of FIG. 1a), transforming the rows of codewords into stepped columns of codeword, to form the interleaving array of FIG. 1b, and then transmitting the rows of the array of FIG. 1b in succession, to form the transmitted stream of FIG. 1c.

Generally, a helically interleaved block code transmits data in a frame of n+1 c-bit symbols. This includes n codeword symbols plus one sync symbol. The first symbol of a transmitted frame is always the last symbol of a codeword, the second symbol of a frame is always the second-to-last symbol of another codeword, etc. The $n^{th}$ symbol of the frame is always the first symbol of the codeword and the n+$1^{st}$ symbol is a sync character. FIGS. 1a, 1b, 1c illustrate a toy example for n=7.

Upon de-interleaving, each received codeword symbol may be associated with all prior information (history) of errors that occurred immediately prior to its receipt. The prior information is the error pattern computed by the decoder during previous codeword times for at least one or more of the symbols transmitted immediately prior to a given symbol in the current codeword. The number of decoded symbols (for which an error pattern has been computed) which are transmitted immediately prior to a given symbol in the current codeword of interest is directly related to the position of the current symbol in the codeword. The first symbol in the codeword has the most prior information and the last symbol in the codeword has the least prior information. The first symbol of a codeword is preceded by n−1 symbols that have been decoded in continuous succession. The second symbol is preceded by exactly n−2 symbols which have been decoded, etc.

This is best illustrated in FIG. 2. In FIG. 2, it is assumed that the decoder is about to decode the codeword denoted "codeword 1" received from the interleaving array of FIG. 1b. Assuming that the decoder has been provided codewords in each of the preceding columns on a column-by-column basis, the symbols shown to the right of "codeword 1" have already been decoded, so that their received error patterns are known by the decoder. More specifically, the symbol in codeword position 1 in the example of FIG. 2, namely symbol 49, was immediately preceded in the transmitted stream of FIG. 1c by symbols 42, 35, etc. (as illustrated in the first row of FIG. 2) and these symbols appeared in earlier codewords which have already been decoded. Thus, the error pattern of symbol 42 may be used to predict whether the next symbol in the transmitted stream of FIG. 1c will have some sort of error pattern. In other words, if symbol 42 was previously identified by the decoder as an error, then the identification of the location of symbol 49 (codeword symbol location 1) as an erasure location before the decoder begins decoding "codeword 1" will save the decoder time and increase its error correction capacity.

The foregoing principles are thoroughly discussed in U.S. Pat. No. 4,559,625 referenced above.

EVALUATING THE ERROR PATTERN

In accordance with the present invention, a more reliable measure for predicting erasures may be obtained by constructing a look-up table which provides an erasure prediction value $E_i$ for the $i^{th}$ location in the next codeword. The erasure prediction value $E_i$ is found by addressing the table with the error pattern $Y_{i+1}$ of the $i+1^{st}$ symbol in the present codeword. Such a look-up table may simply return the number of errors in a given symbol, as one example. Other more sophisticated or less sophisticated schemes may be used to construct the look-up table.

This is best illustrated in FIG. 3, in which a de-interleaver array 120 provides a succession of codewords to a decoder 122, which in turn outputs decoded (corrected) codewords. For each symbol in the current codeword decoded by the decoder 122, the computer error pattern $Y_{i+1}$ is transmitted to a look-up table 124. The look-up table may be implemented as a programmable read only memory or the like. There may be as many as n error patterns in a codeword comprising n symbols with c bits per symbol. Each error pattern comprises a c-bit error symbol. Presumably, for most cases, most of the error patterns in the codeword comprise all zeroes (i.e., no errors). But, where errors actually occurred, the bit pattern for the erroneous codeword symbol will be non-zero. Such a non-zero error pattern for the $i+1^{st}$ codeword symbol will cause the look-up table 24 to generate an erasure prediction $E_i$ for the $i^{th}$ symbol in the next codeword. In one embodiment of the invention, the look-up table 24 provides a prediction $E_i$ whose magnitude is simply the number of non-zero bits in the c-bit error pattern. In another embodiment, $E_i$ is 1, provided the number of non-zero bits exceeds one, and is 0 otherwise.

In accordance with the principles discussed in connection with FIG. 2, the number of error patterns (and corresponding erasure predictions) already computed for symbols transmitted immediately prior to a given codeword symbol is proportional to the position of the symbol of interest in the codeword. All such erasure predictions $E_i$ preceding each given symbol in a codeword may be stored in a set of decision feedback registers 26. The set of decision feedback registers 126 in FIG. 3 has the architecture illustrated in FIG. 4. Decision feedback register 126a (storing all of the erasure predictions associated with the first codeword symbol) stores the most number of erasure predictions (i.e., n−1) while the decision feedback register 126g (storing the erasure predictions associated with the last symbol on the codeword) stores the least number of erasure predictions.

Each of the decision feedback registers 126 stores the set of erasure predictions for symbols transmitted immediately prior to one of the symbols in the present codeword which the decoder 122 is about to decode. These sets of predictions may therefore be used by n erasure prediction processors 128, respectively, to decide whether to predict an erasure for each of the n corresponding locations in the current codeword before the decoder 122 begins decoding the current codeword. In the example of FIGS. 1 and 2, n=7 and there are seven erasure prediction processors 128a–g. Processor 128a processes the erasure predictions contained in decision feedback register 126a, processor 128b processes the erasure predictions contained in decision feedback register 126b, etc. In one embodiment, each of the erasure prediction processors 128 simply computes the average of all of the predictions $E_i$ stored in the corresponding feedback register, and compares that average with a threshold to determine whether or not to predict an erasure for the corresponding symbol in the current codeword.

RECYCLING THE FEEDBACK REGISTERS

Figure 7:
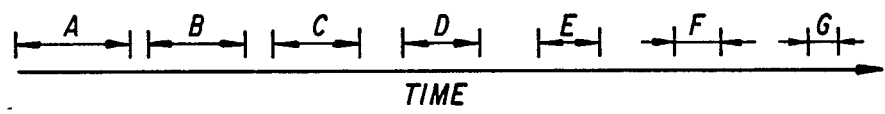
FIG. 7 illustrates a plurality of time windows corresponding to the array of decision feedback registers of FIG. 4.

In accordance with the invention, each of the feedback registers 126a–g receives successive erasure predictions regarding successive symbols in a corresponding one of the rows of the de-interleaving array of FIG. 1b. Thus, each decision feedback register 126a–g receives a succession of erasure predictions from the look-up table 124 regarding those symbols in the transmitted stream of FIG. 1c lying in a respective one of a plurality of time windows A–G (FIG. 7). The first three time windows A–C are illustrated in FIG. 1c. (The placement of the remaining time windows D–G may be readily deduced from FIG. 2 and is illustrated in FIG. 7). The stream of FIG. 1c may be thought of as passing by the time windows A–G while being viewed through them. The time window A associated with the decision feedback register 126a is the largest, while the time window G associated with decision feedback register 126g is the shortest, in accordance with the number of previously decoded symbols associated with each codeword symbol position illustrated in FIG. 2. Each time window includes a respective one of the symbols in the current codeword.

Figure 4:
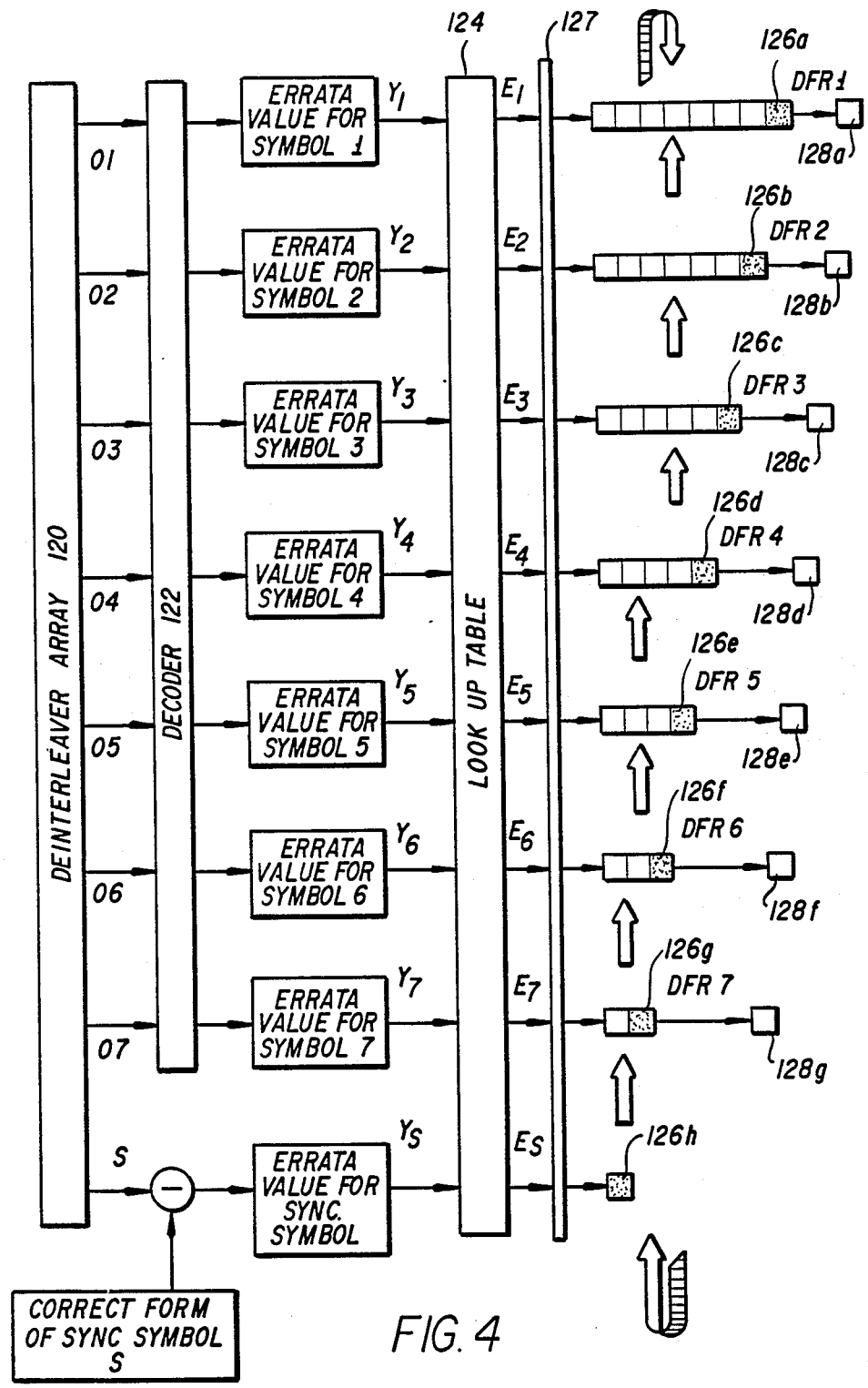
FIG. 4 illustrates the operation of a stepped array of decision feedback registers in one embodiment of the system of FIG. 3.

In order to accomplish the foregoing i.e., maintain a constant association between each one of the time windows A–G and a corresponding one of the decision feedback registers 126a–g—the registers 126a–g must be "recirculated", as indicated in FIG. 4. For example, while the decoder 122 is decoding a given codeword (e.g., symbols 49–55), the decision feedback register 126c is connected to receive the erasure prediction $E_3$ regarding the symbol in codeword position 03 from the look-up table 124. However, while the decoder 122 is decoding the next codeword (i.e., symbols 57-63 in this example), the same decision feedback register is moved "up" one codeword symbol position so as to receive the erasure prediction $E_2$ associated with codeword symbol position 02.

At the same time, the length of the same decision feedback register is increased by one "cell" to accommodate the erasure prediction $E_2$. This is, in effect, a left-to-right shift of the decision feedback register. Thus, the decision feedback register 126c receives the erasure prediction $E_3$ during one codeword "time" and is then moved "up" to become decision feedback register 126b during the next codeword time while being shifted left-to-right, so as to receive the erasure prediction $E_2$. This same process occurs with all of the decision feedback registers 126a-g simultaneously, as denoted in FIG. 4.

As one consequence, the top-most decision feedback register 126a "falls off" the stack. Moreover, the bottom codeword symbol position (number 07) loses its decision feedback register 126g to the next highest position (number 06) during the next codeword time. In order to provide a decision feedback register for the last codeword position (07) during the next codeword time, there is an "extra" decision feedback register 126h which is associated with the sync symbol S accompanying the current codeword (symbols 49-55 in the present example). The "extra" decision feedback register receives an erasure prediction $E_S$ associated with the sync symbol S. This erasure prediction is obtained by addressing the look-up table 124 with the difference $Y_S$ between the received version of the sync symbol S accompanying the current codeword and the correct form of the sync symbol S (which is the same for every codeword). Thereafter, the "extra" decision feedback register 126h is shifted up to become the register 126g during the next codeword time. In this embodiment of the invention, each of the decision feedback registers 126a-g begins its upward sojourn through the array as the bottom-most register 126h, so that its right-most entry (the shaded cells of FIG. 4) is always the sync prediction $E_S$.

The top-most register 126a, which "falls off" the stack of FIG. 4 as noted above, becomes the bottom-most register 126h during a subsequent codeword time, so that all of the registers 126a-h are, in effect, recirculated.

In one embodiment, the registers 126a-h are not moved in a physical sense, but instead are electrically switched to receive the "next" codeword position erasure prediction with each successive codeword decoded by the decoder 120. The switching is performed in a simple fashion by a switching network 127 operating in the manner of an array of cross-bar switches, or the like readily implemented by the skilled worker in accordance with these teachings.

Look-Up Table

The look-up table 124 may be a single read only memory which is addressed by n different error symbols $Y_i$ and provides n respective erasure predictions $E_i$ (where n=7 in the present example). Alternatively, the look-up table 124 may simply comprise n separate read only memories individually addressed by the n error symbols $Y_i$, each read only memory producing a respective one of the erasure predictions $E_i$.

PREFERRED EMBODIMENT OF THE INVENTION

Figure 5:
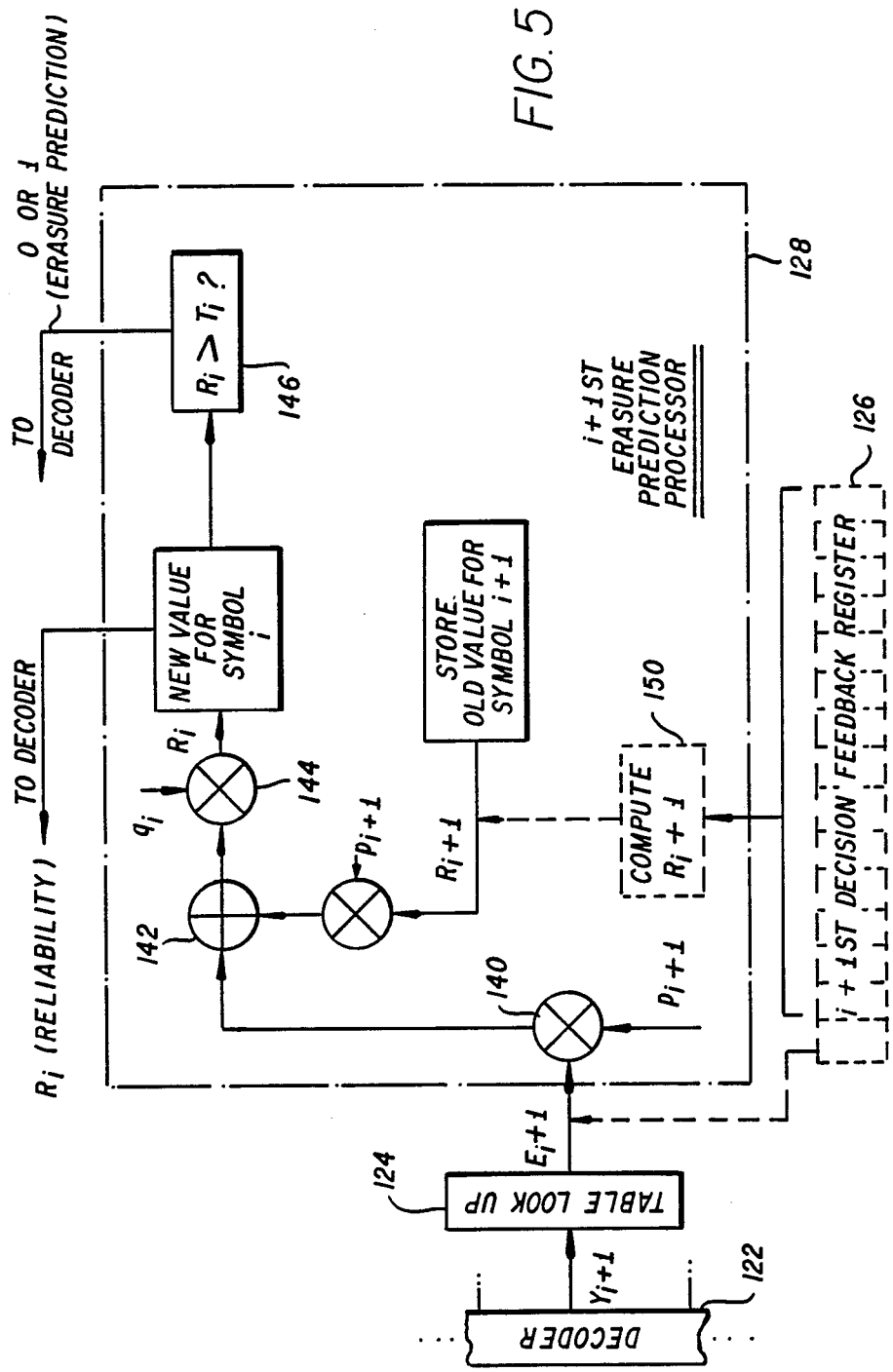
FIG. 5 is a schematic diagram illustrating a portion of the preferred embodiment of the system of FIG. 3.

Referring to FIG. 4, each of the erasure prediction processors 128 may compute a weighted average from the erasure predictions stored in the corresponding decision feedback register 126. In the preferred embodiment of FIG. 5, the decision feedback registers 126a-g are, in effect, replaced by a recursive computation. The erasure prediction for each symbol position in a current codeword is typical. FIG. 5 illustrates the computation of the erasure prediction for the $i^{th}$ codeword symbol. The decoder 122 provides the error pattern $Y_{i+1}$ computed for the $i+1^{st}$ symbol of the previous codeword. This error pattern is applied to the look-up table 124 and addresses a particular one of the erasure prediction values stored in the look-up table 124. The particular erasure prediction value addressed by the error pattern of the $i+1^{st}$ symbol is denoted $E_{i+1}$ and is furnished by the look-up table 124 to the $i+1^{st}$ erasure prediction processor 128 shown in FIG. 5.

A multiplier 140 multiplies the erasure prediction $E_{i+1}$ by a forgetting factor $P_{i+1}$. The resulting product is provided to one input of an adder 142 whose output is multiplied in a multiplier 144 by a skepticism factor $q_i$, the product thus generated by the multiplier 144 being the reliability $R_i$ of the $i^{th}$ symbol of the codeword which the decoder 122 is about to decode.

A decision sub-processor 146 issues a definite erasure prediction to the decoder, identifying the $i^{th}$ symbol in the current codeword as an erasure only if $R_i$ is greater than a threshold $T_i$. (The value of $T_i$ may be selected by the skilled worker as a matter of design choice. For example, if, as mentioned previously, the look-up table 124 simply returns the number of errors (binary "1"'s) in a given error pattern $Y_i$, then all thresholds $T_i$ may be chosen to be some fraction (say ½) of the highest possible number of errors in an error pattern $Y_i$, depending upon anticipated channel error characteristics. As another example, one could use an algorithm--whose description is beyond the scope of this specification—to dynamically vary the thresholds $T_i$ based upon channel error characteristics encountered during system operation.) The other input to the adder 142 is the product of the reliability $R_{i+1}$ of the $i+1^{st}$ symbol of the previous codeword (previously computed by and now temporarily stored in the processor 128) multiplied by $1-p_{i+1}$, the forgetting factor. Thus, the computation performed by the $i+1^{st}$ erasure prediction processor 128 of FIG. 5 is a recursion involving previous reliability values of previous codeword symbols. All that is required in the preferred embodiment of FIG. 5 is that the processor 128 remember only the reliability value associated with the $i+1^{st}$ symbol of the previous codeword. Of course, the processor 128 must also store the forgetting and skepticism factors $q_{i+1}$ and $p_{i+1}$.

Alternatively, one may think of the previous reliability value $R_{i+1}$ as being reconstructed in a sub-processor 50 (illustrated in dashed line in FIG. 5) from all the previous reliability value stored in the corresponding $(i+1^{st})$ decision feedback register 126. The sub-processor 150 simply performs a series of computations on the contents of successive cells in the register 126 equivalent to the single recursive computation just described. Of course, other recursive computations may be chosen which differ from that illustrated in FIG. 5, depending upon the characteristics of the communication channel.

THE PREFERRED UPDATING ALGORITHM OF THE ERASURE PREDICTION PROCESSOR

For each codeword symbol, the algorithm illustrated in FIG. 5 may be stated in equation form for each codeword symbol i at time t as follows:

$$R_i(t+1) = q_i[p_{i+1}E_{i+1}(t) + (1-p_{i+1})R_{i+1}(t)]$$

The $p_i$'s are forgetting factors, and are between 0 and 1. $p_n$ (the forgetting factor of the last codeword symbol) is preferably chosen as 1. The other $p_i$'s are typically less than 1, decreasing with the value of i so that $p_i=0$, for example. The quantity inside the square brackets in the above equation is a weighted average of the new and old data. The closer $p_i$ is to 1, the less emphasis is placed upon the old data. In the forecasting technique disclosed in U.S. Pat. No. 4,559,625 of Berlekamp and Tong, $p_i=1$ in all cases. The optimal value of the $p_i$'s depends upon the decorrelation statistics of the channel. Although examples may be cited where the $p_i$'s should be different, in the preferred embodiment they are all equal.

The $q_i$'s are skepticism factors. In other words, they reflect how much confidence is placed upon the predictions. For example, the prediction for the $n^{th}$ symbol is based on less history than the prediction of the first symbol of the codeword. Consequently, for channels with short decorrelation statistics, the prediction for the first symbol is more reliable than for the $n^{th}$ symbol. This is reflected by making $q_1$ greater than $q_n$. Thus, $q_i$ may decrease from 1 (for i=1) to 0 (for i=n), for example. For memoryless channels, all of the $q_i$'s should be set to 0.

USE IN SOFT DECISION DECODERS

The invention is particularly effective if the decoder 122 is a soft decision Reed-Solomon decoder such as that described in U.S. Pat. No. 4,821,268 issued Apr. 11, 1989 by Elwyn R. Berlekamp and entitled "Reed-Solomon Soft Decision Decoder." In the decoder described in the referenced Berlekamp application, each of the symbols in a given codeword must first be sorted into descending order of reliability. Reliability is determined by the degree of resemblance of each symbol in the received codeword to an allowed symbol of the code which it most closely resembles. Then the soft decision decoder 122 executes the Welch-Berlekamp algorithm, operating on the most reliable symbol first and operating on the lesser reliable symbols during subsequent iterations of the algorithm. Intermediate results (i.e., error locations and error values) are obtained after some of the iterations, which may obviate the need to perform all of the iterations of the algorithm, thereby saving processing time.

The present invention may be used in the soft decision Reed-Solomon decoder of the Berlekamp application to determine the relative reliability of each codeword symbol based upon the results obtained from the previous codeword. It thus replaces the process of the Berlekamp application of determining symbol reliability by observing the degree of resemblance of each received codeword symbol with all of the allowed symbols of the code.

Figure 6:
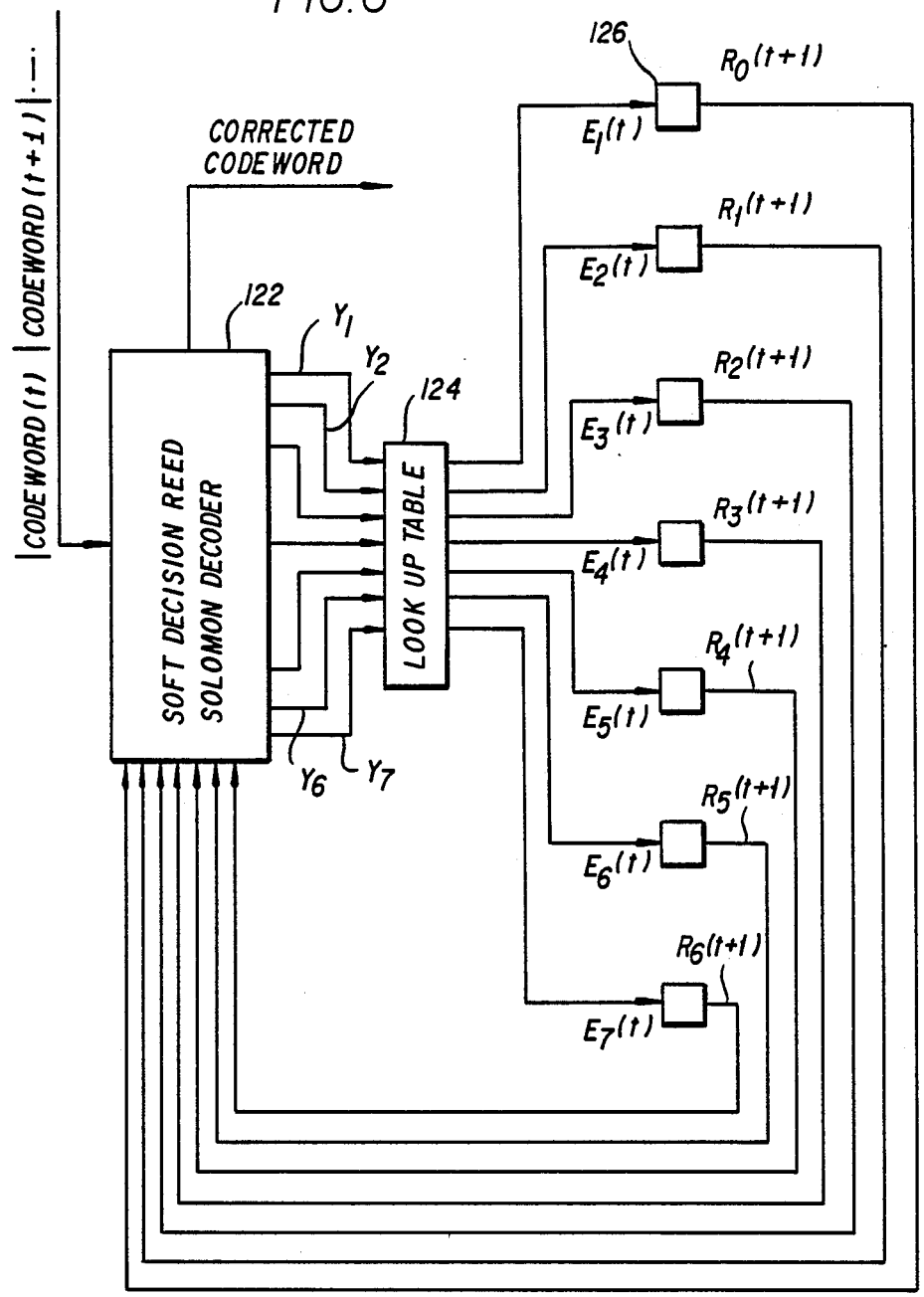
FIG. 6 is a diagram illustrating the use of the invention with a soft decision error correction decoder.

In this embodiment of the invention (FIG. 6), the reliability values $R_i$ of the n symbols of the current codeword computed by the n processors 128 are used by the decoder 122 to sort the corresponding symbols of the next codeword into descending order of magnitude of their forecasted reliabilities $R_i$. In this embodiment, the decoder 122 is the soft decision Reed-Solomon decoder described in the above-referenced Berlekamp application, except that $R_i$ is substituted as a measure of reliability, rather than the comparison with allowed codeword symbols of each of the received symbols. Thus, as illustrated in FIG. 5 in dashed line, each of the n reliability measures $R_i$ is transmitted to the soft decision decoder 122. Then, after the symbols have been appropriately sorted in descending order of reliability $R_i$, the decoder 122 performs the Welch-Berlekamp algorithm, beginning with the most reliable symbol, and proceeding in order, performing subsequent iterations of the algorithm with symbols of lesser reliability. In this preferred embodiment, the threshold processor 46 may be eliminated from FIG. 5.

While the invention has been described in detail by reference to preferred embodiments thereof, it is understood that variations and modifications thereof may be made without departing from the spirit and scope of the invention.

What is claimed is:

1. A de-interleaving decoder adapted to receive a helically interleaved block of codewords, each of said codewords comprising n symbols, some of said symbols liable to be corrupted by errors or erasures therein, said de-interleaving decoder comprising:

de-interleaving array means for receiving said helically interleaved block and transmitting the n symbols of each of said codewords in said block;

decoding means for generating, from said n symbols, error correction symbols, non-zero ones of said error symbols corresponding to corrupted ones of said n symbols;

look-up table means addressable by each of said error symbols for producing in response thereto an erasure prediction value for a corresponding symbol position in one codeword already decoded by said decoding means and applicable to an adjacent symbol position in a subsequent codeword not yet decoded by said decoder means, whereby an erasure prediction value is produced for each of said error symbols;

means for transmitting a prediction based upon said erasure prediction value to said decoder before said decoder begins decoding said subsequent codeword.

2. The de-interleaving decoder of claim 1 wherein said erasure prediction value is based upon the number of erroneous bits in said error symbol, said erasure prediction value inferring the reliability of the corresponding codeword symbol.

3. The de-interleaving decoder of claim 2,
   wherein said means for decoding said codeword is capable of correcting more erasures, whose locations in a given codeword have been predetermined, than it is of correcting errors whose locations have not been predetermined in said codeword, and wherein said transmitting means determines whether said reliability exceeds a threshold value, wherein said prediction indicates that said adjacent symbol position in said subsequent codeword contains an erasure whenever said reliability exceeds said threshold value.

4. The de-interleaving decoder of claim 1
   wherein said means for decoding said codeword comprises a soft decision decoder which processes in succession said n codeword symbols in descending order of their respective reliabilities, and wherein said prediction comprises the reliability of the corresponding symbol in said subsequent codeword, whereby said decoding means associates each symbol in said subsequent codeword with the reliability corresponding to an adjacent symbol position in the previous codeword so as to construct said descending order of reliabilities.

5. The de-interleaving decoder of claim 1 further comprising processing means for computing said prediction from said erasure prediction value, wherein said prediction comprises a reliability value.

6. The deinterleaving decoder of claim 5 wherein said processing means further computes said prediction from a set of erasure prediction values which (a) include said erasure prediction value and (b) are associated with a plurality of successive codeword symbols in said interleaved block.

7. The de-interleaving decoder of claim 5 wherein said computing means computes a reliability value from (a) said erasure prediction value and (b) a reliability value previously computed for an adjacent codeword position in a previous codeword.

8. The de-interleaving decoder of claim 7 wherein said computing means discounts said previous reliability value with respect to said erasure prediction value.

9. The de-interleaving decoder of claim 8 wherein the reliability value associated with the $i^{th}$ symbol position for the codeword decoded at time t is $R_i(t+1)$ and the look-up table value obtained for the $i^{th}$ codeword position at time t is $E_i(t)$, and wherein said processing means computes the reliability value for each codeword position in accordance with the following formula:

$$R_i(t+1) = (R_{i+1}(t)(1-p_i) + p_i E_{i+1}(t)) q_i,$$

where $p_i$ is a forgetting factor associated with the $i^{th}$ codeword position and $q_i$ is a skepticism factor associated with the $i^{th}$ codeword position, where $p_i$ and $q_i$ each lie within the range from and including zero to and including one.

10. The de-interleaving decoder of claim 8 wherein said prediction specifies to the decoding means a given codeword position as an erasure location in the next codeword to be decoded if the corresponding reliability value is outside of a given bound.

11. The de-interleaving decoder of claim 8 wherein said decoding means comprises a soft decision decoder which decodes each codeword by processing each of the n symbols therein successively in descending order of their relative reliabilities, and wherein said relative reliabilities comprise said reliability values.

12. The de-interleaving decoder of claim 8 wherein said predictive processor means computes said prediction by computing the average of the contents of a corresponding one of said decision feedback register means.

13. The de-interleaving decoder of claim 5 wherein said prediction processor means comprises a plurality of n decision feedback register means each adapted to receive a prediction for one of the n symbol positions of a codeword, and wherein each of said n decision feedback register means receives the prediction associated with an adjacent codeword position in the subsequent codeword, whereby each of said n feedback decision register means stores a series of predictions in the order in which the corresponding codeword symbols were transmitted in said block of helically interleaved codewords.

14. The de-interleaving decoder of claim 13 wherein said computing means computes n reliability values by computing the average of the contents of each of said n decision feedback register means.

15. The de-interleaving decoder adapted to receive a helically interleaved block of codewords, each of said codewords comprising n symbols, said de-interleaving decoder comprising:

de-interleaving array means for providing from said helically interleaved block of codewords the n symbols of successive codewords therein;

means for decoding each of said successive codewords and for providing therefrom n error symbols, non-zero ones of said n error symbols corresponding to corrupted symbols in a codeword;

read only memory means addressable by said n error symbols and adapted to produce in response thereto n erasure prediction values;

predictive processing means for computing a prediction from the erasure prediction value associated with a given codeword symbol position in a previous codeword already decoded by said decoding means, and for transmitting said prediction to said decoding means as a prediction for an adjacent codeword symbol position in a subsequent codeword yet to be decoded by said decoding means, whereby said decoding means uses said prediction in decoding said subsequent codeword.

16. The de-interleaving decoder of claim 15 wherein each of said erasure prediction values corresponds to the number of non-zero bits in a corresponding one of said error symbols.

17. The de-interleaving decoder of claim 15 wherein said prediction is a reliability value for a symbol position in one codeword and wherein said processing means computes said reliability value from an erasure prediction value and a previous reliability value computed for an adjacent symbol position in a previous codeword.

18. The de-interleaving decoder of claim 17 wherein said previous reliability value is discounted with respect to the corresponding erasure prediction value in accordance with a forgetting factor.

19. The de-interleaving decoder of claim 15 further comprising n decision feedback register means, and wherein, as said helically interleaved codewords are successively decoded by said decoding means, said read only memory means produces n streams of erasure prediction symbols associated with said n codeword positions, whereby said n erasure prediction symbol streams are stored temporarily among said n decision feedback register means, each of said n decision feedback register means receiving an erasure prediction symbol associated with a given symbol position in a subsequent codeword adjacent the symbol position of an erasure prediction symbol it received for a previous codeword, so that each of said n decision feedback register means stores a stream of erasure prediction symbols in an order corresponding to the order of codeword symbols in said block of helically interleaved codewords.

20. The de-interleaving decoder of claim 17 wherein, for each reliability value of a given codeword symbol location failing a certain reliability threshold, said processor means transmits an adjacent symbol location to said decoding means as being the symbol location of an erasure in the next codeword to be decoded by said decoding means.

21. A process for decoding a helically interleaved block of codewords, each of said codewords comprising n symbols, said process comprising:
receiving said block of helically interleaved codewords and providing therefrom the n symbols of successive codewords thereof;
decoding in accordance with a given code each of said codewords so as to generate n error symbols corresponding thereto;
computing n reliabilities from said n error symbols, wherein said decoder treats each of said n reliabilities associated with a given codeword position as a prediction for an adjacent codeword position in the next codeword to be decoded.

22. The process of claim 21 wherein said computing step comprises:
associating in a look-up table each of said n error symbols with a corresponding erasure prediction symbol from which a reliability may be inferred.

23. The process of claim 21 wherein, as said process is performed for a succession of codewords in said block, said computing step generates n sets of successive reliabilities, and wherein said computing step further comprises recursively combining each errata symbol associated with a codeword symbol position with a corresponding reliability value previously computed for the same codeword symbol position, said previous reliability value being discounted with respect to said errata symbol in proportion to a forgetting factor.

24. The process of claim 21 wherein said process generates a succession of sets of n errata symbols whenever said process is performed for a succession of said codewords in said block, and wherein said computing step comprises arranging said errata symbols in n time windows in the order in which the corresponding codeword symbols occur in said block of helically interleaved codewords and combining the erasure prediction symbols contained within respective ones of said time windows in order to produce said n reliability values.

25. The process of claim 23 wherein said prediction specifies an erasure whenever said reliability value fails a certain threshold reliability.

26. The process of claim 21 wherein said decoding step comprises arranging the n symbols of a given codeword in descending order of said n reliabilities associated therewith, and processing said symbols in said descending order.

* * * * *